United States Patent
Park

(10) Patent No.: US 7,915,096 B2
(45) Date of Patent: Mar. 29, 2011

(54) SEMICONDUCTOR DEVICE AND METHOD FOR FABRICATING THE SAME

(75) Inventor: Hyung Jin Park, Icheon-si (KR)

(73) Assignee: Hynix Semiconductor Inc., Icheon-si (KR)

(*) Notice: Subject to any disclaimer, the term of this patent is extended or adjusted under 35 U.S.C. 154(b) by 54 days.

(21) Appl. No.: 12/116,643

(22) Filed: May 7, 2008

(65) Prior Publication Data

US 2009/0230506 A1  Sep. 17, 2009

(30) Foreign Application Priority Data

Mar. 11, 2008  (KR) .................. 10-2008-0022619

(51) Int. Cl.
*H01L 21/82* (2006.01)
*H01L 21/332* (2006.01)

(52) U.S. Cl. ............... 438/132; 257/E21.003; 438/281

(58) Field of Classification Search .......... 438/215, 438/281, 132, 333, 467; 257/529, 209, 530
See application file for complete search history.

(56) References Cited

U.S. PATENT DOCUMENTS

| | | | |
|---|---|---|---|
| 6,040,615 A * | 3/2000 | Nagai et al. | 257/529 |
| 6,096,566 A * | 8/2000 | MacPherson et al. | 438/4 |
| 7,202,497 B2 * | 4/2007 | Ohtani et al. | 257/59 |
| 2005/0161766 A1 | 7/2005 | Sato et al. | |
| 2006/0189113 A1 * | 8/2006 | Vanheusden et al. | 438/597 |

FOREIGN PATENT DOCUMENTS

| KR | 10-1997-0024026 | 5/1997 |
|---|---|---|
| WO | WO 2004/097898 A2 | 11/2004 |

OTHER PUBLICATIONS

Heeger, "Nobel Lecture: Semiconducting and metallic polymers: the fourth generation of polymeric materials," *Review of Modern Physics* 73:681-700 (2001).
Heeger, "Plastic Electronics and Optoelectronics," *Device Research Conference Digest* 1:3-3 (2005).
Lee et al., "Metallic transport in polyaniline," *Nature* 441:65-68 (2006).

* cited by examiner

*Primary Examiner* — Chuong A. Luu
*Assistant Examiner* — Nga Doan
(74) *Attorney, Agent, or Firm* — Kilpatrick Townsend & Stockton LLP

(57) ABSTRACT

A semiconductor device includes a fuse pattern formed as conductive polymer layer having a low melting point. The fuse pattern is easily cut at low temperature to improve repair efficiency. The semiconductor device includes first and second fuse connecting patterns that are separated from each other by a distance, a fuse pattern including a conductive polymer layer formed between the first and second fuse connection patterns and connecting the first and second fuse connection patterns, and a fuse box structure that exposes the fuse pattern.

13 Claims, 9 Drawing Sheets

SEMICONDUCTOR DEVICE AND METHOD FOR FABRICATING THE SAME

CROSS-REFERENCES TO RELATED APPLICATIONS

The priority of Korean patent application number 10-2008-22619, filed on Mar. 11, 2008, which is incorporated by reference in its entirety, is claimed.

BACKGROUND OF THE INVENTION

The present invention relates to a semiconductor device, and more specifically, to a semiconductor device including a fuse pattern formed as a conductive polymer layer having a low melting point which can be easily cut at low temperature to improve repair efficiency.

In manufacturing semiconductor devices, if even one of many cells of the device has a defect, the device can not serve as a memory and is treated as defective.

However, it is inefficient in terms of yield to disuse the device because a cell of the memory has a defect.

A redundancy cell which is previously installed in the memory device is used to replace a defective cell to repair the entire memory, thereby improving yield.

The repair method using a redundancy cell includes replacing a normal word line having a defect or a normal bit line having a defect with a redundancy word line or a redundancy bit line which is disposed in each cell array.

When a defective cell is found through a test after processing a wafer, an internal circuit performs a program for replacing an address corresponding to the defective cell with an address of a redundancy cell. As a result, an address signal corresponding to the defective cell in its actual use is inputted to access data of the redundancy cell.

Generally, the program system includes burning and blowing a fuse with a laser beam to replace a path of an address. As a result, a common memory device includes a fuse unit configured to replace an address path by irradiating and blowing a fuse with a laser. A fuse refers to a line cut by irradiation by a laser, and a fuse box refers to the cut site and its surrounding region.

The fuse unit has a plurality of fuse sets. One fuse set can replace an address path. The number of fuse sets in the fuse box is determined by the number of redundancy word lines or redundancy bit lines in the memory device.

In general, a method for fabricating a semiconductor device includes forming an interlayer insulating film planarized over a fuse region of a semiconductor substrate, forming a metal fuse over the interlayer insulating film, and forming an insulating film and a protective film over the semiconductor substrate to cover the metal fuse.

A part of the protective film and the insulating film is etched to form a fuse open region so that a given thickness of the insulating film remains over the metal fuse of a local blowing region. The fuse open region is irradiated with a laser, and a blowing process is performed to cut a given metal fuse.

Since the insulating film has a property such as glass, laser energy is not absorbed in the insulating film but passed through the insulating film. As a result, most of the laser energy is absorbed into the metal fuse. The metal fuse is thermally expanded by the laser energy, and the insulating film surrounding the metal fuse is broken when the thermal expansion reaches a critical point. As a result, the metal fuse is instantly vaporized and physically cut.

However, an efficient repair process cannot be performed because the excellent thermal conductivity of the metal fuse is disperses the laser energy in the blowing process. Stress caused when the insulating film is broken may affect a chip. Also, it is difficult to control fuse cutting because the laser energy is changed depending on a thickness of the insulating film that remains over the metal fuse. Moreover, it is difficult to regulate the required thickness of the insulating film remaining over the metal fuse due to a step difference in one wafer.

BRIEF SUMMARY OF THE INVENTION

Various embodiments of the present invention relate to a semiconductor device comprising a fuse pattern formed as a conductive polymer layer having a low melting point, which can be easily cut at low temperature to improve repair efficiency.

Various embodiments of the present invention are directed at preventing crack generation due to stress of an interlayer insulating film in a blowing process because an insulating film does not remain over a fuse pattern.

According to an embodiment of the present invention, a semiconductor device comprises: a fuse pattern including a conductive polymer layer formed in a blowing region; a fuse connecting pattern that connects the fuse pattern electrically; and a fuse box structure that exposes the fuse pattern of the blowing region.

According to an embodiment of the present invention, a method for fabricating a semiconductor device comprises: forming a first and a second fuse connecting patterns over a semiconductor substrate; forming an interlayer insulating film over the semiconductor substrate including the first and second fuse connecting patterns; etching the interlayer insulating film to form a mold region that exposes the semiconductor substrate between the first and second fuse connecting patterns; forming a conductive polymer layer that fills the mold region; and planarizing the conductive polymer layer and the interlayer insulating film to form a fuse pattern.

According to an embodiment of the present invention, a method for fabricating a semiconductor device comprises: forming a first and a second fuse connecting patterns over a semiconductor substrate; forming an interlayer insulating film over the semiconductor substrate including the first and second fuse connecting patterns; etching the interlayer insulating film to form a mold region including a recess disposed between the first and second fuse connecting patterns; forming a conductive polymer layer that fills the mold region; and planarizing the conductive polymer layer and the interlayer insulating film to form a fuse pattern.

DESCRIPTION OF EMBODIMENTS

Figure 1:
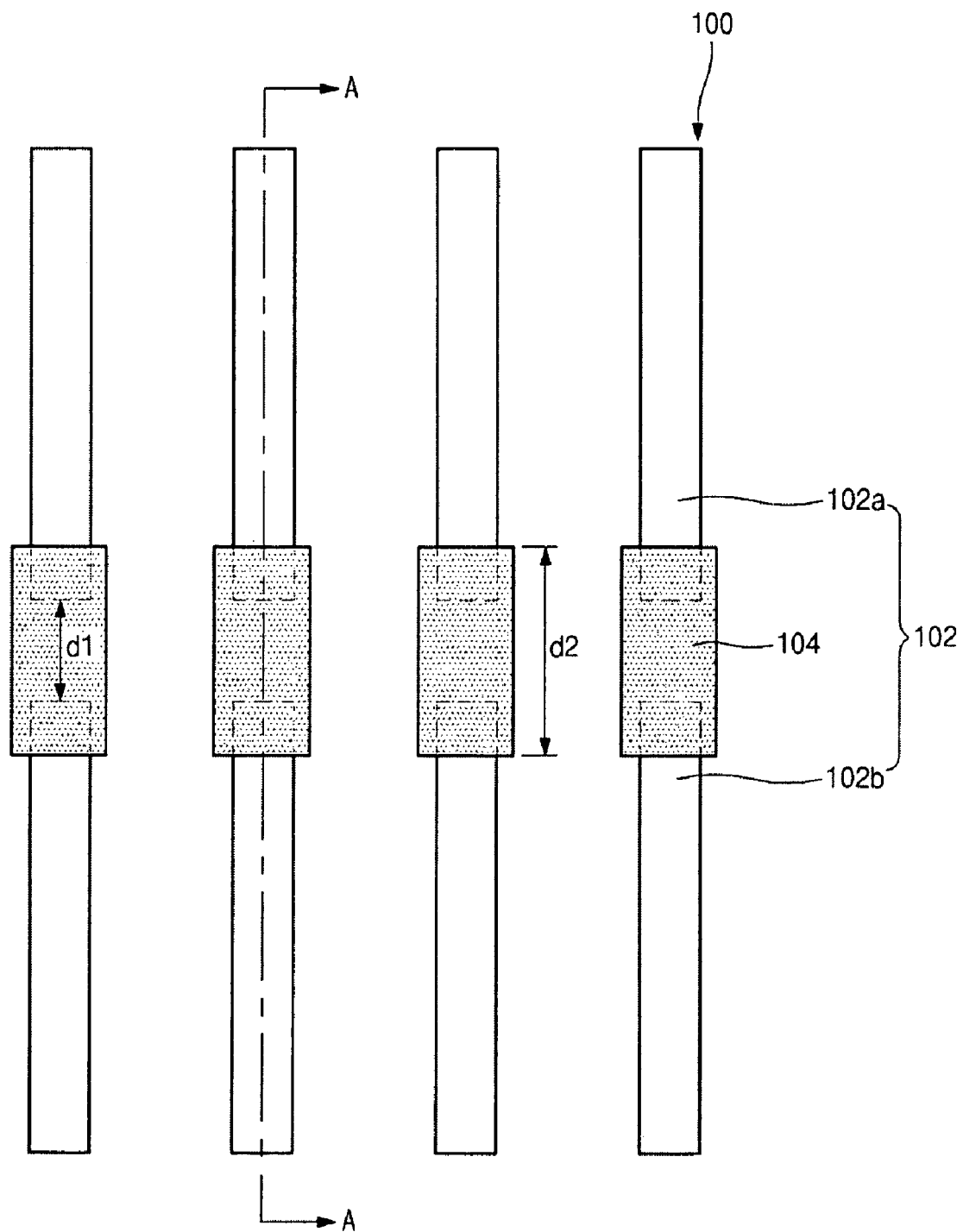
FIG. 1 is a plan view illustrating a method for fabricating a semiconductor device according to an embodiment of the present invention.

FIG. 1 is a plan view illustrating a method for fabricating a semiconductor device according to an embodiment of the present invention.

A fuse 100 includes a fuse connecting pattern 102 and a fuse pattern 104. The fuse connecting pattern 102 includes a first fuse connecting pattern 102a and a second fuse connecting pattern 102b that have a line type. A distance d1 between the first fuse connecting pattern 102a and the second fuse connecting pattern 102b is formed under consideration of a critical dimension CD of a micro hot needle in a blowing process.

For example, when the CD of the micro hot needle is 500 nm, the distance d1 between the first fuse connecting pattern 102a and the second fuse connecting pattern 102b ranges from 500 to 550 nm. The fuse connecting pattern 102 includes the same material as that of a first metal line of a cell region, for example, aluminum (Al).

The fuse pattern 104 is disposed between the first fuse connecting pattern 102a and the second fuse connecting pattern 102b, and electrically connected with an internal circuit. The fuse pattern 104 formed in a blowing region is burned out by a laser beam or cut by the micro hot needle. The fuse pattern 104 is formed to have one selected from the group consisting of an oval type, a circular type, a rectangular type and combinations thereof.

A major axis width d2 of the fuse pattern 104 having a line type is formed under consideration of a spot size of the laser beam used in the blowing process. The fuse pattern 104 includes a conductive polymer layer which is a metal polymer layer.

FIGS. 2a to 2g are cross-sectional diagrams illustrating a method for fabricating a semiconductor device according to an embodiment of the present invention, taken along A-A' of FIG. 1.

Figure 2A:
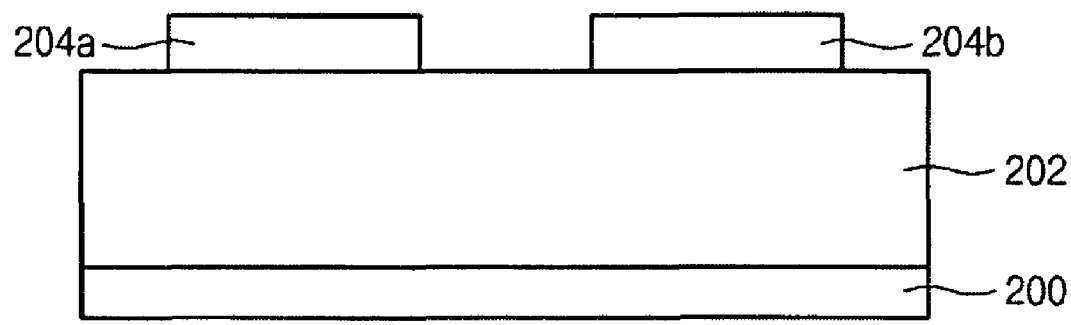
FIGS. 2a to 2g are cross-sectional diagrams illustrating a method for fabricating a semiconductor device according to an embodiment of the present invention.

Referring to FIG. 2a, a first interlayer insulating film 202 is formed over a fuse box region of a semiconductor substrate 200. The first interlayer insulating film 202 includes an oxide film. A first fuse connecting pattern 204a and a second fuse connecting pattern 204b are formed on the first interlayer insulating film 202. The first fuse connecting pattern 204a is the same as the first connecting pattern 102a shown in FIG. 1, and the second fuse connecting pattern 204b is the same as the second fuse connecting pattern 102b shown in FIG. 1.

The first and second fuse connecting patterns 204a and 204b are formed in a line type. A fuse pattern to be formed in a subsequent process is electrically connected to an internal circuit. The first and second fuse connecting patterns 204a and 204b include the same material as that of a first metal line formed in a cell region, for example, aluminum (Al). The first and second fuse connecting patterns 204a and 204b are each formed to have a thickness ranging from about 4500 to about 5500 Å.

Figure 2B:
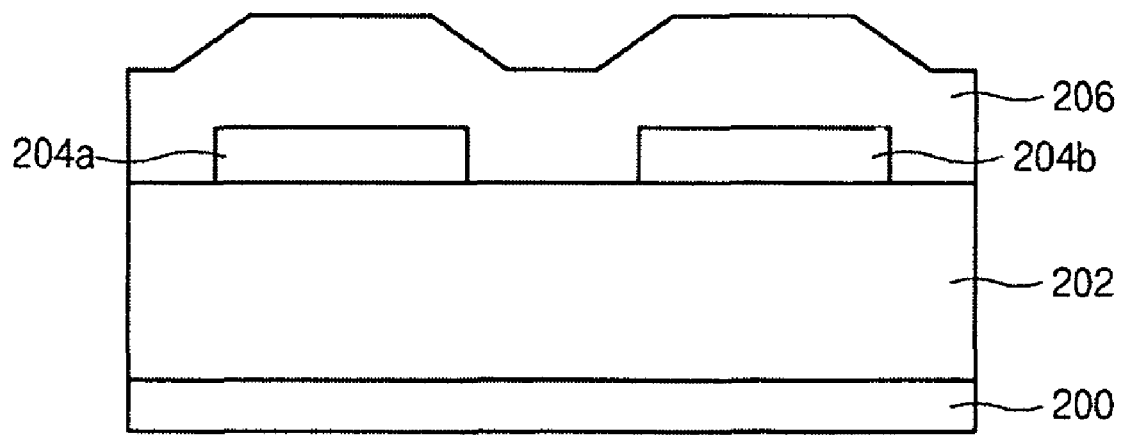

Referring to FIG. 2b, a second interlayer insulating film 206 is formed over the semiconductor substrate including the first and second fuse connecting patterns 204a and 204b. The second interlayer insulating film 206 includes an oxide film to have a thickness ranging from about 8000 to about 11000 Å.

Figure 2C:
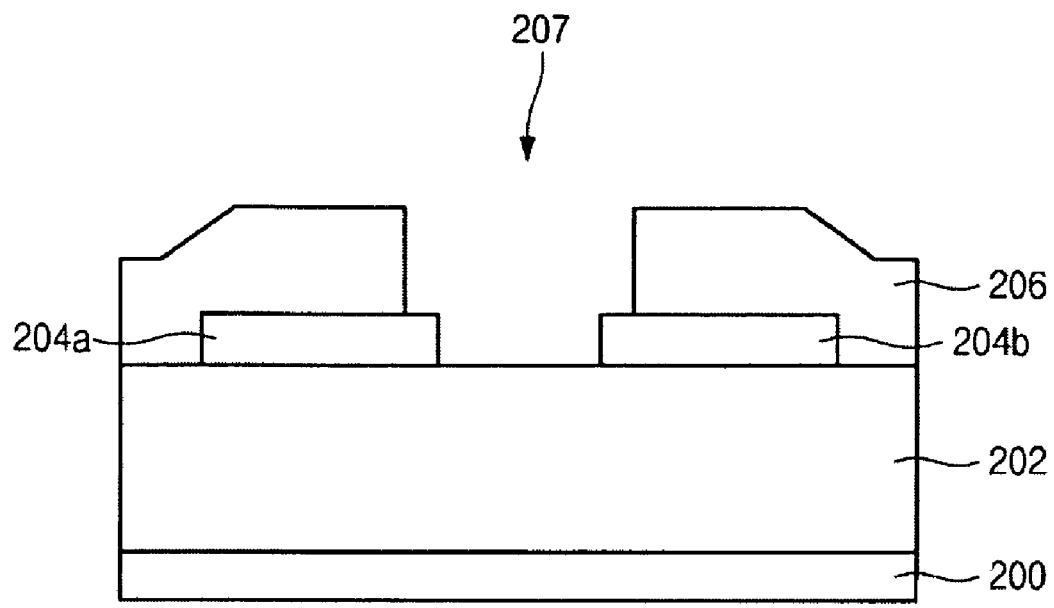

Referring to FIG. 2c, the second interlayer insulating film 206 is etched by a photo-etching process with a mask that defines a shape of the fuse pattern to form a mold region 207 that exposes the first interlayer insulating film 202 between the first and second fuse connecting patterns 204a and 204b. The mask is in a shape of a rectangle. Also, the mask may be in a shape of one selected from the group consisting of an oval, a circular, and combinations thereof.

Figure 2D:
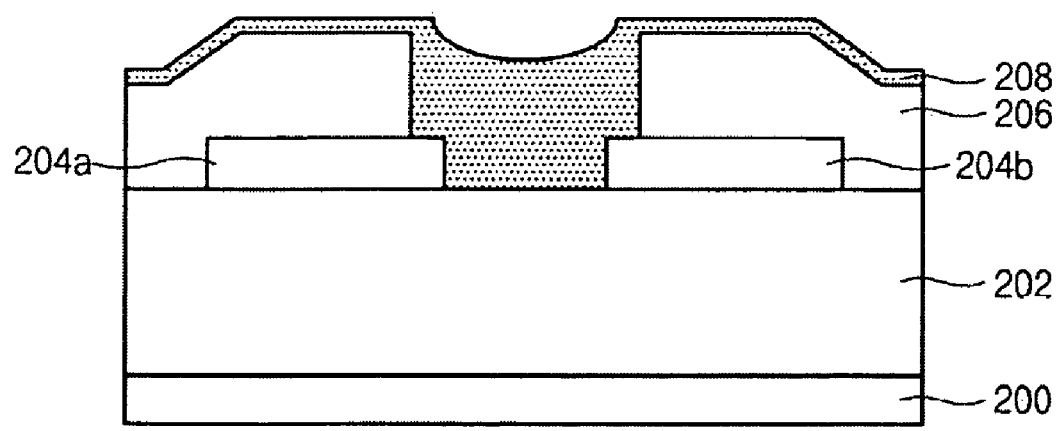

Referring to FIG. 2d, a fuse material film 208 is formed over the second interlayer insulating film 206 and in the mold region 207. The fuse material film 208 includes a conductive polymer layer having a low melting point, and is formed by a curing treatment.

The conductive polymer layer includes a metal polymer layer. The metal polymer layer is formed by mixing a nano-sized metal powder as a solute with a polymer as a solvent. The metal powder includes one selected from the group consisting of Al, Ag, Cu and combinations thereof. The polymer includes a photoresist or a photosensitive polymide.

The amount of the metal powder is mixed so as to show conductivity of the fuse material film 208. For example, when a photoresist is used as a solvent, 2 ml of the photoresist is dispensed in a 30 mm wafer, and the metal powder is mixed ranging from 5 to 2000 µg The amount of the solute is determined under consideration of the unit volume of the fuse pattern when each width in directions X, Y, Z of the fuse pattern ranges from 500 to 1000 nm. The solvent has viscosity ranging from about 1 to about 5 P. The curing process of the fuse material film 208 is performed at about 110 to about 350° C. for about 60 to about 90 minutes.

In order to have the conductivity of the fuse material film 208, the metal powder is mixed in the polymer layer. Otherwise, the polymer layer is mixed with other compounds; to generate electrons or charges by oxidation and reduction reactions, which is called a chemical doping method. Moreover, an electric doping method for applying an external bias voltage to the polymer layer may be used. Also, N-type or P-type impurities may be implanted into the polymer layer.

Figure 2E:
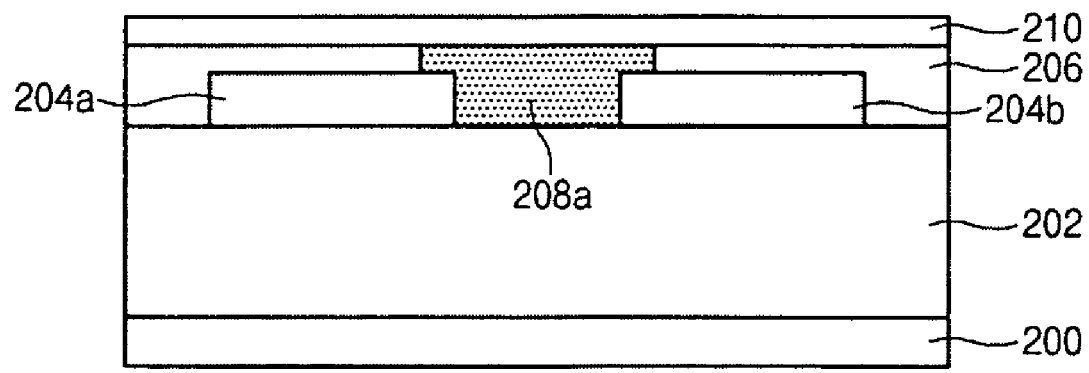
Figure 2F:
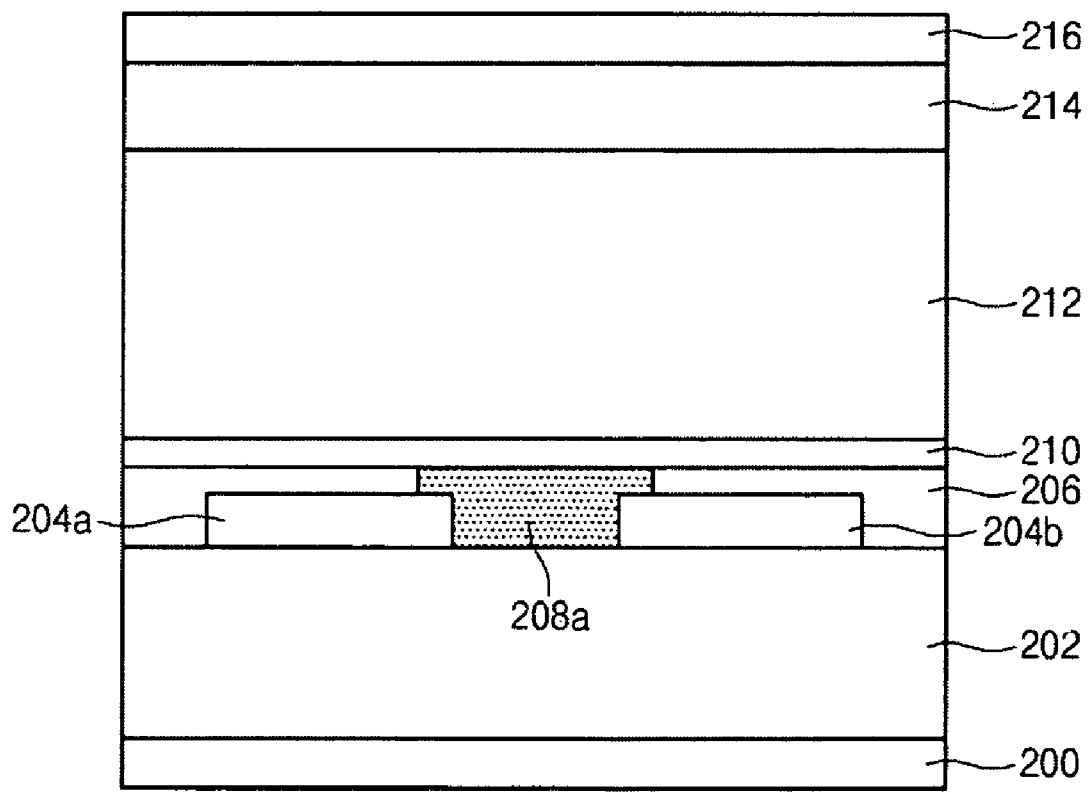
Figure 2G:
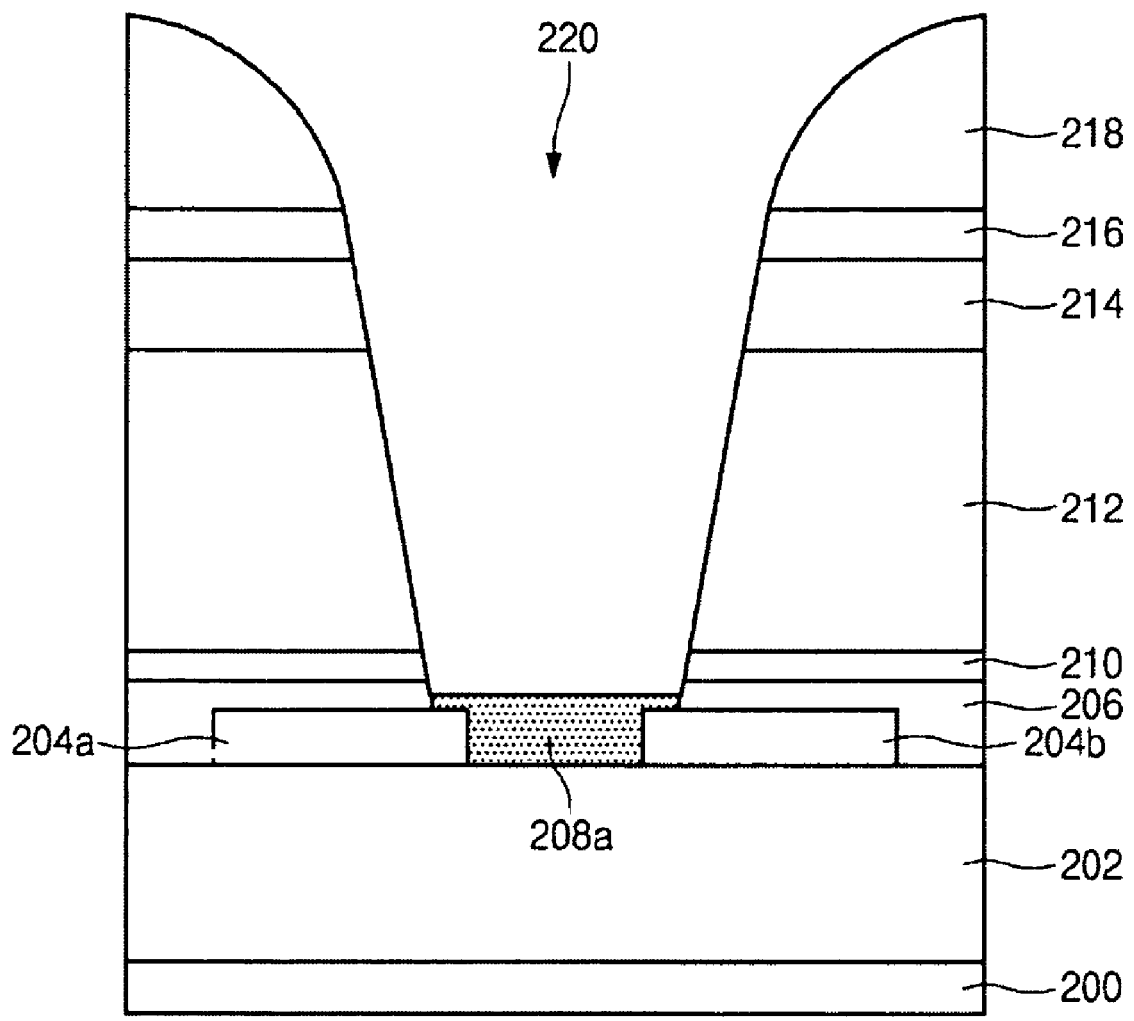

Referring to FIGS. 2e to 2g, the fuse material film 208 and the second interlayer insulating film 206 are planarized to form a fuse pattern 208a. The fuse pattern 208a is the same as the fuse pattern 104 shown in FIG. 1. The planarizing process is performed by one selected from the group consisting of a chemical mechanical polishing (CMP) method, an etch-back method, a blank etching method and combinations thereof.

The following details show how the fuse pattern 208a is formed. The fuse material film 208 is blank-etched to expose the second interlayer insulating film 206. A partial thickness of the second interlayer insulating film 206 is wet-etched to remove the fuse material film 208 which remains over the second interlayer insulating film 206. The wet-etching process is performed until the second interlayer insulating film 206 remains ranging from about 7000 to about 10000 Å. A CMP process is performed on the second interlayer insulating film 206 and the fuse material film 208, thereby obtaining the fuse pattern 208a. The fuse pattern 208a is formed to have a thickness 1.0~1.2 times larger than that of the first and second fuse connecting patterns 204a and 204b.

An insulating film is formed over the fuse pattern 208a and the second interlayer insulating film 206. The insulating film includes a third interlayer insulating film 210, a fourth interlayer insulating film 212, a first protective film 214, a second protective film 216 and a polymide isoindro quirazorindione (PIQ) film 218. The third interlayer insulating film 210 includes an oxide film ranging from about 5000 to about 6000 Å.

The fourth interlayer insulating film 212 includes a second metal line contact plug (not shown), a second metal line (not shown), a third metal line contact plug (not shown) and a third metal line (not shown). A process for the fourth interlayer insulating film 212 is a common process, which is not explained. The first protective film 214 includes an oxide film, and the second protective film 216 includes a nitride film.

The PIQ film 218, the second protective film 216, the first protective film 214, the fourth interlayer insulating film 212 and the third interlayer insulating film 210 are etched by a photo-etching process with a repair mask to form a blowing region 220 that exposes the fuse pattern 208a. A fuse box structure is formed.

A blowing process is performed to cut the fuse pattern 208a corresponding to a defective address. The blowing process includes burning the fuse pattern 208a with a laser beam and cutting the fuse pattern 207a with a micro hot needle. The laser beam includes one selected from KrF (248 nm), ArF (193 nm), $F_2$ (157 nm), EUV (13 nm) and I-line (365 nm).

FIGS. 3a to 3f are cross-sectional diagrams illustrating a method for fabricating a semiconductor device according to an embodiment of the present invention.

Figure 3A:
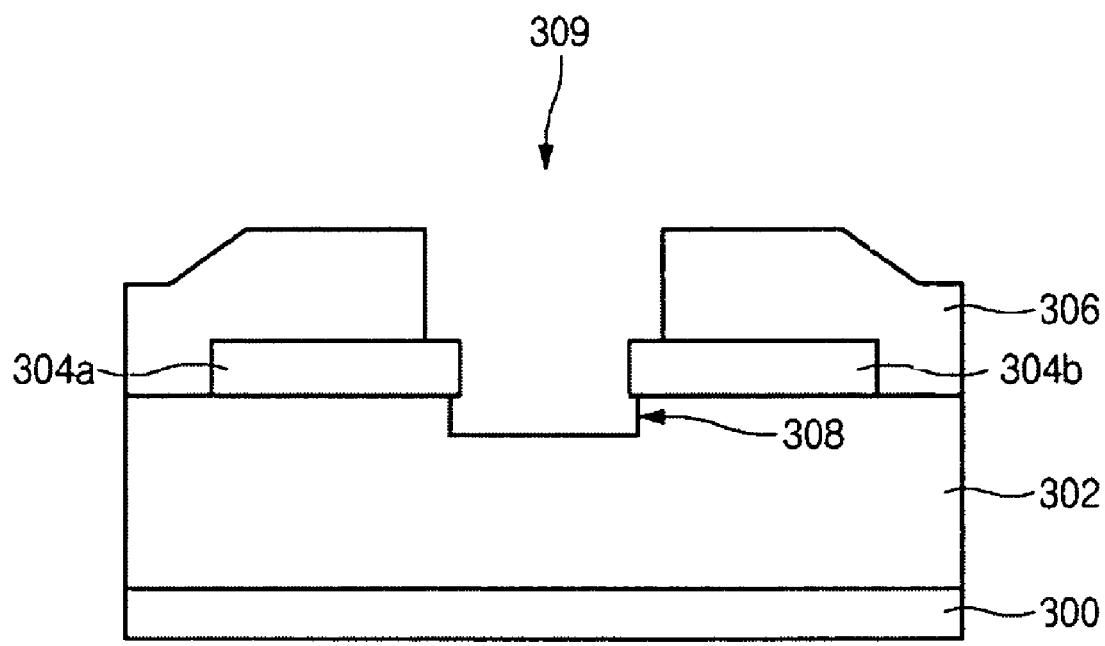
FIGS. 3a to 3f are cross-sectional diagrams illustrating a method for fabricating a semiconductor device according to an embodiment of the present invention.

Referring to FIG. 3a, a first interlayer insulating film 302 is formed over a fuse box region of a semiconductor substrate 300. The first interlayer insulating film 302 includes an oxide film. A first fuse connecting pattern 304a and a second fuse connecting pattern 304b are formed over the first interlayer insulating film 302. The first connecting pattern 304a is the same as the first fuse connecting pattern 102a shown in FIG. 1, and the second fuse connecting pattern 304b is the same as the second fuse connecting pattern 102b shown in FIG. 1.

The first and second fuse connecting patterns 304a and 304b are formed in a line type. A fuse pattern to be formed in a subsequent process is electrically connected to an internal circuit. The first and second fuse connecting patterns 304a and 304b include the same material as that of a first metal line formed in a cell region, for example, aluminum (Al). The first and second fuse connecting patterns 304a and 304b are each formed to have a thickness ranging from about 4500 to about 5500 Å.

A second interlayer insulating film (not shown) is formed over the semiconductor substrate 300 including the first and second fuse connecting patterns 304a and 304b. The second interlayer insulating is film includes an oxide film to have a thickness ranging from about 8000 to about 11000 Å.

The second interlayer insulating film is etched by a photo-etching process with a mask that defines a local fuse pattern to expose the first interlayer insulating film 302 between the first and second fuse connecting patterns 304a and 304b. The first interlayer insulating film 302 is etched to form a mold region 309 including a recess 308.

The mask is in a shape of a rectangle. The mask can also be in a shape of one selected from the group consisting of an oval, a circular, and combinations thereof. The recess 308 is formed to have a depth ranging from about 500 to about 1000 Å. The etching process of the first interlayer insulating film 302 is performed by a dry-etching method or a wet-etching method.

The recess 308 is formed to have the same interval as that between the first and second fuse connecting patterns 304a and 304b or to have an under-cut type in the dry-etching process. The recess 308 is formed to have an under-cut type by the wet-etching process. FIG. 3a shows that a sidewall of the recess 308 is further etched while formed to have the same interval as that between the first and second fuse connecting patterns 304a and 304b.

Figure 3B:
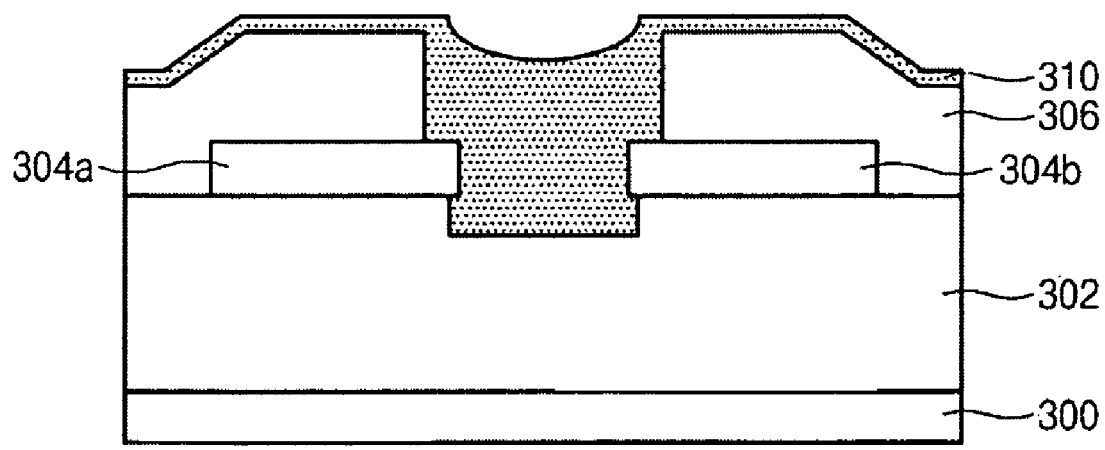

Referring to FIG. 3b, a fuse material film 310 is formed over the second interlayer insulating film 306 including a mold region 309. The fuse material film 310 includes a conductive polymer layer having a low melting point, and is formed by a curing treatment. The conductive polymer layer is a metal polymer layer.

The conductive polymer layer includes a metal polymer layer. The metal polymer layer is formed by mixing a nano-sized metal powder as a solute with a polymer as a solvent. The metal powder includes one selected from the group consisting of Al, Ag, Cu and combinations thereof. The polymer includes a photoresist or a photosensitive polymide. The solvent has viscosity ranging from about 1 to about 5 P. The curing process of the fuse material film 310 is performed at about 110 to about 350° C. for about 60 to about 90 minutes.

In order to have conductivity in the fuse material film 310, a metal powder is mixed in the polymer layer. Otherwise, the polymer layer is mixed with other compounds to generate electrons or charges by oxidation and reduction reactions, which is called a chemical doping method. Moreover, an electric doping method for applying an external bias voltage to the polymer layer may be used. Also, N-type or P-type impurities may be implanted into the polymer layer.

Figure 3C:
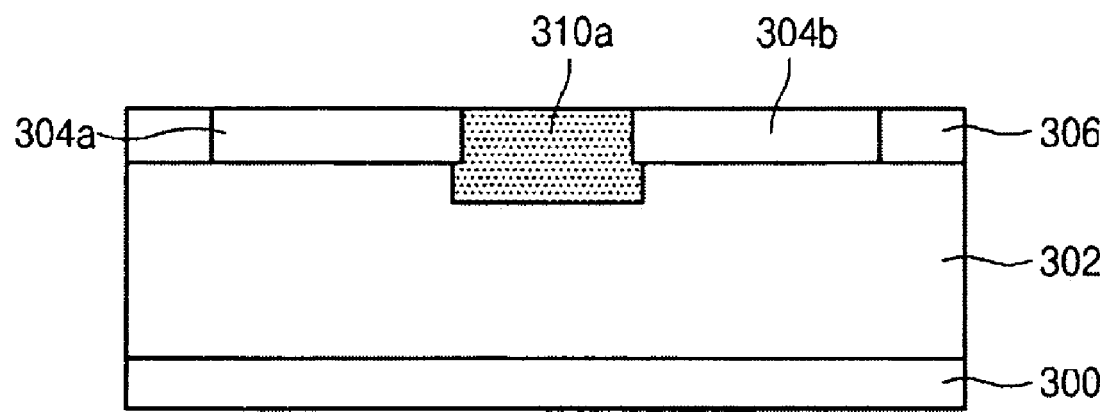
Figure 3D:
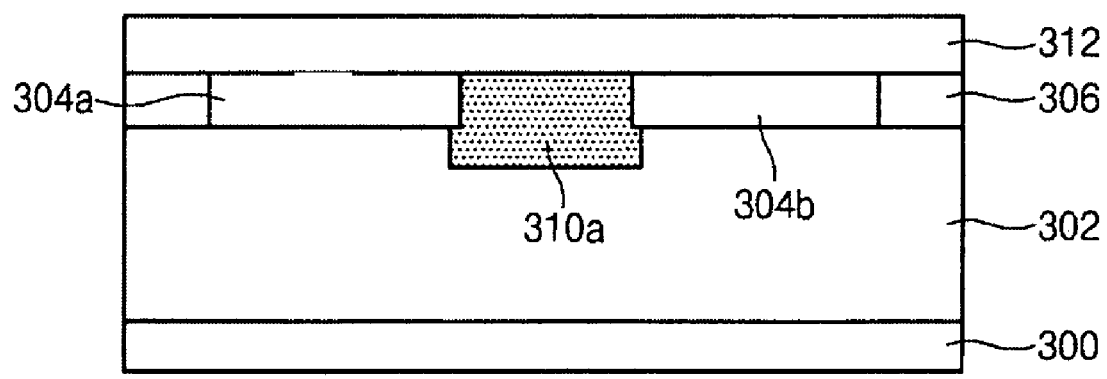
Figure 3E:
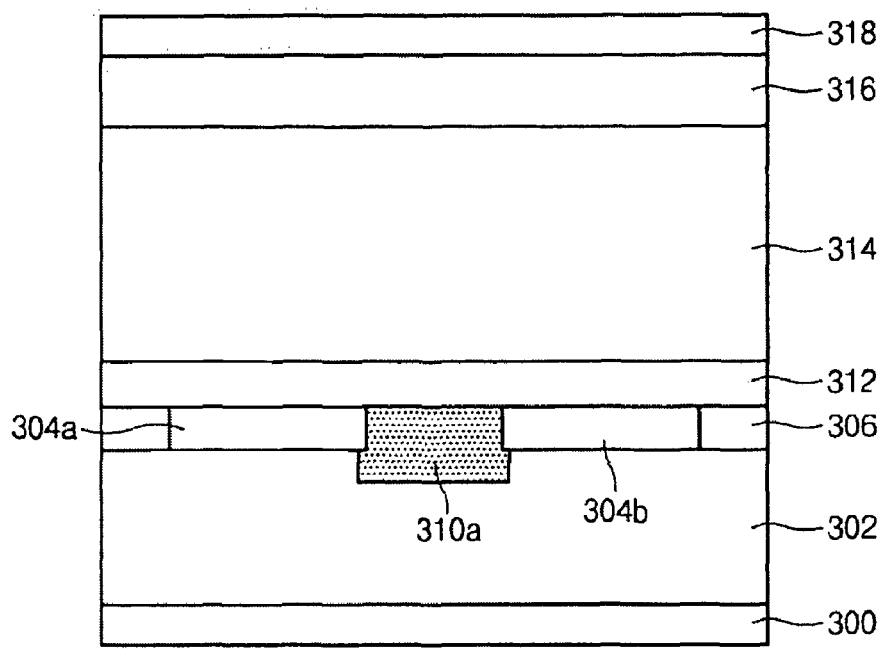
Figure 3F:
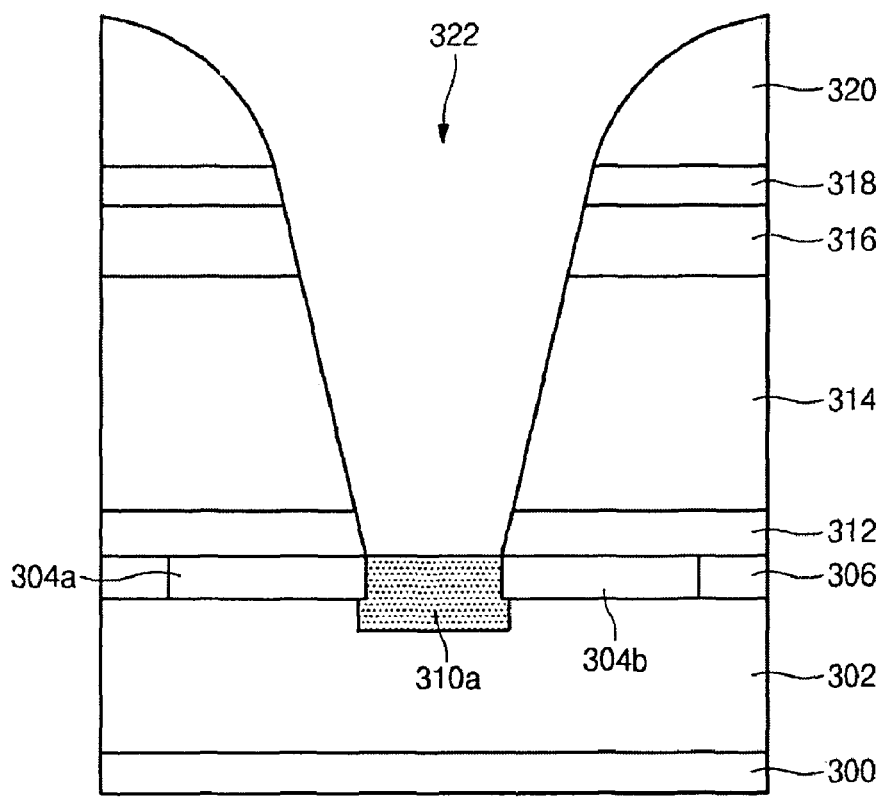

Referring to FIG. 3c, the fuse material film 310 and the second interlayer insulating film 306 are planarized to form a fuse pattern 310a until the first and second fuse connecting patterns 304a and 304b are exposed. The fuse pattern 310a is the same as the fuse pattern 104 shown in FIG. 1. The planarizing process of the fuse material film 310 and the second interlayer insulating film 306 is performed by one selected from the group consisting of a chemical mechanical polishing (CMP) method, an etch-back method, a blank etching method and combinations thereof.

An insulating film is formed over the fuse pattern 310a and the second interlayer insulating film 306. The insulating film includes a third interlayer insulating film 312, a fourth interlayer insulating film 314, a first protective film 316, a second protective film 318 and a PIQ film 320. The third interlayer insulating film 312 includes an oxide film ranging from about 5000 to about 6000 Å.

The fourth interlayer insulating film 314 includes a second metal line contact plug (not shown), a second metal line (not shown), a third metal line contact plug (not shown) and a third metal line (not shown). A process for the fourth interlayer insulating film 316 is a common process, which is not explained. The first protective film 316 includes an oxide film, and the second protective film 318 includes a nitride film.

The polymide film 320, the second protective film 318, the first protective film 316, the fourth interlayer insulating film 314 and the third interlayer insulating film 312 are etched by a photo-etching process with a repair mask to form a blowing region 322 that exposes the fuse pattern 310a. A fuse box structure is formed.

A blowing process is performed to cut the fuse pattern 310a corresponding to a defective address. The blowing process includes is burning the fuse pattern 310a with a laser beam and pressing the fuse pattern 310a with a micro hot needle to have a high resistance state. The laser beam includes one selected from KrF (248 nm), ArF (193 nm), $F_2$ (157 nm), EUV (13 nm) and I-line (365 nm).

Figure 4:
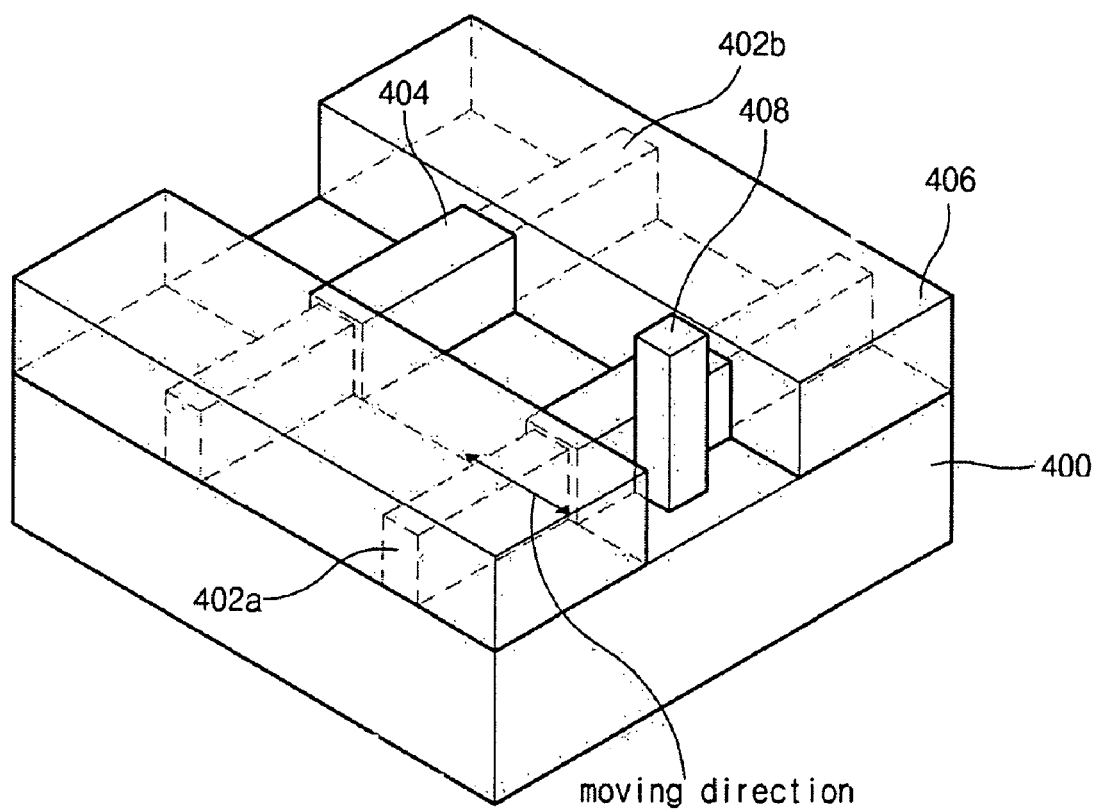
FIG. 4 is a three-dimensional diagram illustrating a blowing process according to an embodiment of the present invention.

FIG. 4 is a three-dimensional diagram illustrating a blowing process according to an embodiment of the present invention.

Referring to FIG. 4, a first fuse connecting pattern 402a and a second fuse connecting pattern 402b are formed in a line type over a fuse box region of a semiconductor substrate 400. A fuse pattern 404 is formed between the first and second fuse connecting patterns 402a and 402b. The first fuse connecting pattern 402a is the same as the first fuse connecting pattern 102a shown in FIG. 1, and the second fuse connecting pattern 402b is the same as the second fuse connecting pattern 102b shown in FIG. 1. The fuse pattern 404 is the same as the fuse pattern 104 shown in FIG. 1. A fuse box structure 406 is formed to expose the fuse pattern 404 of a blowing region.

When a micro hot needle 408 is used in a blowing process, a difference between the embodiments in FIGS. 2a to 2g and FIGS. 3a to 3f is as follows The embodiment shown in FIGS. 2a to 2g includes moving a micro hot needle 408 to cut the fuse pattern 404. The movement direction is vertical to a major axis direction of the fuse pattern 404.

The embodiment shown in FIGS. 3a to 3f includes pressing the fuse pattern 404 with the micro hot needle 408 so that the fuse is pattern 404 has a high resistance state. That is, current does not flow in the fuse pattern so as to have the same state when the fuse pattern 404 is cut.

As described above, according to an embodiment of the present invention, a method for fabricating a semiconductor device comprises forming a fuse pattern as a conductive polymer layer having a low melting point, which can be easily cut at low temperature to improve repair efficiency.

The method also prevents crack generation due to stress of an interlayer insulating film in a blowing process because an insulating film does not remain over a fuse pattern.

The above embodiments of the present invention are illustrative and not limitative. Various alternatives and equivalents are possible. The invention is not limited by the type of deposition, etching polishing, and patterning steps described herein. Nor is the invention limited to any specific type of semiconductor device. For example, the present invention may be implemented in a dynamic random access memory (DRAM) device or non volatile memory device. Other additions, subtractions, or modifications are obvious in view of the present disclosure and are intended to fall within the scope of the appended claims.

What is claimed is:

1. A method for fabricating a semiconductor device, the method comprising:
   forming first and second fuse connecting patterns over a semiconductor substrate;
   forming an interlayer insulating film over the semiconductor substrate including the first and second fuse connecting patterns;
   etching the interlayer insulating film to form a mold region that exposes a portion of the semiconductor substrate between the first and second fuse connecting patterns;
   forming a metal polymer layer that fills the mold region, wherein the metal polymer layer is formed by mixing a nano-sized metal powder as a solute with a polymer as a solvent; and
   planarizing the metal polymer layer and the interlayer insulating film to form a fuse pattern.

2. The method according to claim 1, wherein the first and second fuse connecting patterns include a metal line material.

3. The method according to claim 1, wherein the etching-the-interlayer-insulating-film step is performed by a photo-etching process with a mask that defines a fuse pattern forming region.

4. The method according to claim 3, wherein the mask has a shape of a rectangular.

5. The method according to claim 3, wherein the mask has a shape of an oval or a circle.

6. The method according to claim 1, wherein the metal powder includes one selected from the group consisting of Al, Ag, Cu and combinations thereof.

7. The method according to claim 1, wherein the polymer includes a photoresist or a photosensitive polymide.

8. The method according to claim 1, wherein the polymer has viscosity ranging from 1 to 5 P.

9. The method according to claim 1, further comprising curing the metal polymer layer after forming the metal polymer layer.

10. The method according to claim 9, wherein the curing the metal polymer layer is performed at 110~350° C. for 60~90 minutes.

11. The method according to claim 1, wherein the planarizing-the-metal-polymer-layer step is performed by one selected from the group consisting of a chemical mechanical polishing (CMP) method, an etch-back method, a blank etching method and combinations thereof.

12. The method according to claim 1, further comprising after forming the fuse pattern:
   forming an insulating film over the semiconductor substrate including the fuse pattern; and
   etching the insulating film by a photo-etching process with a repair mask to form a blowing region that exposes the fuse pattern.

13. The method according to claim 1, further comprising blowing the fuse pattern using a laser beam or a micro hot needle.

* * * * *